United States Patent
Yang et al.

(10) Patent No.: US 11,204,868 B2
(45) Date of Patent: Dec. 21, 2021

(54) METHOD FOR CONTROLLING SLICES OF MEMORY TO BE TURNED ON OR OFF, CONTROLLER, CHIP AND ELECTRONIC DEVICE

(71) Applicant: BAIDU ONLINE NETWORK TECHNOLOGY (BEIJING) CO., LTD., Beijing (CN)

(72) Inventors: Bibo Yang, Beijing (CN); Xiaoping Yan, Beijing (CN); Chao Tian, Beijing (CN); Junhui Wen, Beijing (CN)

(73) Assignee: BAIDU ONLINE NETWORK TECHNOLOGY (BEIJING) CO., LTD., Beijing (CN)

( * ) Notice: Subject to any disclaimer, the term of this patent is extended or adjusted under 35 U.S.C. 154(b) by 5 days.

(21) Appl. No.: 16/824,648

(22) Filed: Mar. 19, 2020

(65) Prior Publication Data

US 2021/0096989 A1  Apr. 1, 2021

(30) Foreign Application Priority Data

Sep. 29, 2019  (CN) .......................... 201910931678.4

(51) Int. Cl.
*G06F 12/06* (2006.01)
*G06F 3/06* (2006.01)
*G11C 11/413* (2006.01)

(52) U.S. Cl.
CPC ........ *G06F 12/0646* (2013.01); *G06F 3/0625* (2013.01); *G06F 3/0644* (2013.01);
(Continued)

(58) Field of Classification Search
CPC .... G06F 3/0625; G06F 3/0644; G06F 3/0658; G06F 12/0646; G06F 2212/1028
See application file for complete search history.

(56) References Cited

U.S. PATENT DOCUMENTS 6,981,126 B1 * 12/2005 Blodgett ............. G06F 12/0215
711/213
2006/0069886 A1 3/2006 Tulyani
(Continued)

FOREIGN PATENT DOCUMENTS

CN 101520688 A 9/2009
CN 105573473 A 5/2016
(Continued)

OTHER PUBLICATIONS

The first Office Action of the priority CN application No. 201910931678.4.

*Primary Examiner* — Tracy A Warren
(74) *Attorney, Agent, or Firm* — J.C. Patents (57) ABSTRACT

The present application discloses a memory control method, a controller, a chip and an electronic device, and relates to the field of control technology. A specific implementation solution is: obtaining first address information of an access to the memory performed by the processor within a first time window; determining, according to the first address information and an address jump relationship, a target slice of the memory that is to be accessed by the processor within a second time window; and controlling the target slice in the memory to be turned on and controlling a slice other than the target slice in the memory to be turned off within the second time window. Through the above-mentioned process, each slice is dynamically turned on and off according to the actual situation of memory access, thereby reducing the power consumption of the memory to the maximum extent.

14 Claims, 6 Drawing Sheets

(52) U.S. Cl.
CPC .......... *G06F 3/0658* (2013.01); *G11C 11/413* (2013.01); *G06F 2212/1028* (2013.01)

(56) References Cited

U.S. PATENT DOCUMENTS

| | | | | |
|---|---|---|---|---|
| 2006/0135094 A1* | 6/2006 | Dor | .................. | G06F 1/3296 |
| | | | | 455/127.1 |
| 2011/0029797 A1* | 2/2011 | Vaden | ................ | G06F 11/3055 |
| | | | | 713/324 |
| 2017/0249085 A1* | 8/2017 | Airaud | ................ | G06F 12/0646 |
| 2018/0321865 A1* | 11/2018 | Watkins | ................ | G06F 3/0625 |

FOREIGN PATENT DOCUMENTS

| | | | |
|---|---|---|---|
| CN | 108052293 | A | 5/2018 |
| JP | H10105367 | A | 4/1998 |
| JP | 2010015375 | A | 1/2010 |
| WO | WO2015062316 | | 5/2015 |

\* cited by examiner

METHOD FOR CONTROLLING SLICES OF MEMORY TO BE TURNED ON OR OFF, CONTROLLER, CHIP AND ELECTRONIC DEVICE

CROSS-REFERENCE TO RELATED APPLICATIONS

This application claims priority to Chinese application No. 201910931678.4, filed on Sep. 29, 2019, which is incorporated by reference in its entirety.

TECHNICAL FIELD

The present application relates to the field of control technology, and in particular, to a memory control method, a controller, a chip and an electronic device.

BACKGROUND

Power consumption of a chip has a great impact on standby time and battery life of a product. In the design of a chip, a memory occupies more than half the area of the chip, so the power consumption of the memory affects the average power consumption and peak power consumption of the entire chip.

Currently, a static control method is used for the memory to reduce the power consumption of the memory. Exemplarily, a chip includes a processor and a memory. The memory is divided into multiple slices according to address ranges, and each slice has its own clock circuit and power circuit. The processor controls the clock circuit or the power circuit of each slice according to a preset rule. For example, the clock circuits and power circuits of all slices are turned on when the processor is in a working state, and the clock circuits or power circuits of some slices are turned off when the processor is in a sleep state.

However, the above-mentioned static control method can only control the working mode of the slices of the memory with a coarse granularity. In some working scenarios, there are still some unused working slices in the memory which still generate additional power consumption. Therefore, how to reduce the power consumption of the memory to the maximum extent is an urgent problem to be solved.

SUMMARY

The present application provides a memory control method, a controller, a chip and an electronic device, to implement dynamic control of each slice of a memory, so as to reduce the power consumption of the memory to the maximum extent.

In a first aspect, the present application provides a memory control method, where the method is applied to an electronic device, the electronic device includes a memory, a processor and a controller, the memory includes a plurality of slices, and the method is performed by the controller and includes:

obtaining first address information of an access to the memory performed by the processor within a first time window;

determining, according to the first address information and an address jump relationship, a target slice of the memory which is to be accessed by the processor within a second time window, where the address jump relationship is used to indicate an access jump relationship between different addresses of the memory, and the second time window is a time window after the first time window; and controlling the target slice in the memory to be turned on and controlling a slice other than the target slice in the memory to be turned off within the second time window.

In the present application, through the above-mentioned process, each slice is dynamically turned on and off according to the actual situation of memory access. In each time window, only the target slice that needs to be accessed within the time window is required to be turned on, and other slice is turned off, and therefore, there is no unused working slice in each time window, thereby reducing the power consumption of the memory to the maximum extent.

In a possible implementation, the determining, according to the first address information and an address jump relationship, a target slice of the memory which is to be accessed by the processor within a second time window includes:

determining, according to the first address information and the address jump relationship, second address information of an access to the memory performed by the processor within the second time window; and determining, according to the second address information and an address range corresponding to each slice, the target slice of the memory which is to be accessed by the processor within the second time window.

In a possible implementation, the controlling the target slice in the memory to be turned on and controlling a slice other than the target slice in the memory to be turned off includes:

controlling a clock circuit and a power circuit corresponding to the target slice in the memory to be turned on, and controlling a clock circuit or a power circuit corresponding to the slice other than the target slice in the memory to be turned off.

In this implementation, the existing hardware foundation (the clock circuit and the power circuit) is used to control each slice, which can reduce the implementation cost.

In a possible implementation, the electronic device further includes a detector; and the obtaining first address information of an access to the memory performed by the processor within a first time window includes:

receiving, from the detector, the first address information of the access to the memory performed by the processor within the first time window, where the first address information is obtained by the detector through collecting an address at which the memory is accessed.

In a possible implementation, before the determining, according to the first address information and an address jump relationship, a target slice of the memory which is to be accessed by the processor within a second time window, the method further includes:

receiving the address jump relationship from the detector, where the address jump relationship is generated by the detector according to access data, and the access data is used to indicate access addresses corresponding to different times;

where the access data is obtained by the detector through collecting addresses at which the memory is accessed when the processor is in different operation states.

In a possible implementation, the first address information includes: an access timestamp, an access base address, and an access byte number corresponding to each access to the memory.

In a possible implementation, the memory is a static random-access memory (SRAM).

In a second aspect, the present application provides a controller, where the controller is applied to an electronic device, the electronic device includes a memory, a processor and the controller, the memory includes a plurality of slices, and the controller includes:

an obtaining module, configured to obtain first address information of an access to the memory performed by the processor within a first time window;

a determining module, configured to determine, according to the first address information and an address jump relationship, a target slice of the memory which is to be accessed by the processor within a second time window, where the address jump relationship is used to indicate an access jump relationship between different addresses of the memory, and the second time window is a time window after the first time window; and a controlling module, configured to control the target slice in the memory to be turned on and control a slice other than the target slice in the memory to be turned off within the second time window.

In a possible implementation, the determining module is configured to:

determine, according to the first address information and the address jump relationship, second address information of an access to the memory by the processor within the second time window; and determine, according to the second address information and an address range corresponding to each of the slices, the target slice of the memory which is to be accessed by the processor within the second time window.

In a possible implementation, the controlling module is configured to:

control a clock circuit and a power circuit corresponding to the target slice in the memory to be turned on, and control a clock circuit or a power circuit corresponding to the slice other than the target slice in the memory to be turned off.

In a possible implementation, the electronic device further includes a detector, and the obtaining module is specifically configured to:

receive, from the detector, the first address information of the access to the memory performed by the processor within first time window, where the first address information is obtained by the detector through collecting an address at which the memory is accessed.

In a possible implementation, the obtaining module is further configured to:

receive the address jump relationship from the detector, where the address jump relationship is generated by the detector according to access data, and the access data is used to indicate access addresses corresponding to different times;

where the access data is obtained by the detector through collecting addresses at which the memory is accessed when the processor is in different operation states.

In a possible implementation, the first address information includes: an access timestamp, an access base address, and an access byte number corresponding to each access to the memory.

In a possible implementation, the memory is a static random-access memory (SRAM).

In a third aspect, the present application provides a chip, including: a processor, a memory, a detector and a controller, where the detector is connected to the memory, and the detector is configured to generate an address jump relationship according to addresses at which the memory is accessed by the processor; where the detector is further configured to collect first address information of an access to the memory performed by the processor within a first time window; and the controller is configured to perform any method of the first aspect.

In a fourth aspect, the present application provides an electronic device, including: the chip according to the third aspect.

The present application provides a memory control method, a controller, a chip and an electronic device, where the method includes: obtaining first address information of an access to the memory performed by the processor within a first time window; determining, according to the first address information and an address jump relationship, a target slice of the memory which is to be accessed by the processor within a second time window, where the address jump relationship is used to indicate an access jump relationship between different addresses of the memory, and the second time window is a time window after the first time window; and controlling the target slice in the memory to be turned on and controlling a slice other than the target slice in the memory to be turned off within the second time window. Through the above-mentioned process, each slice is dynamically turned on and off according to the actual situation of memory access. In each time window, only the target slice that needs to be accessed in the time window is required to be turned on, and other slice is turned off, and therefore there is no unused working slice in each time window, thereby reducing the power consumption of the memory to the maximum extent.

Other effects of the above optional implementations will be described below in conjunction with specific embodiments.

BRIEF DESCRIPTION OF THE DRAWINGS

The drawings are used for a better understanding of the solution, and do not constitute a limitation to the present application. where.

DESCRIPTION OF EMBODIMENTS

Exemplary embodiments of the present application are described below with reference to the accompanying drawings, various details of the embodiments of the present application are included to facilitate understanding, and they should be considered as merely exemplary. Therefore, those of ordinary skill in the art should recognize that various changes and modifications can be made to the embodiments described herein without departing from the scope and spirit of the application. Also, for clarity and conciseness, description of well-known functions and structures is omitted in the following description.

In order to facilitate the understanding of the present application, the structure of the electronic device in the prior art and the structure of the electronic device in the present application will be described first.

Figure 1:
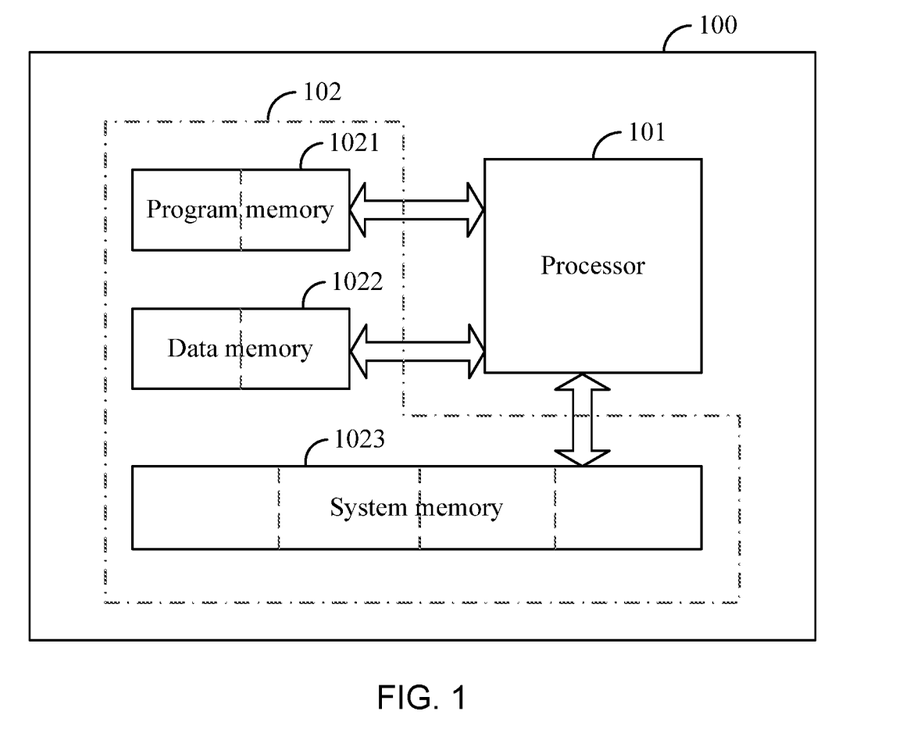
FIG. 1 is a schematic structural diagram of a conventional electronic device.

FIG. 1 is a schematic structural diagram of a conventional electronic device. As shown in FIG. 1, the electronic device 100 includes a processor 101, a memory 102, and interfaces for connecting various components, including a high-speed interface and a low-speed interface. The various components are interconnected using different buses and can be mounted on a common motherboard or otherwise mounted as required. There may be one or more processors 101, which can process instructions executed in the electronic device, including instructions stored in or on the memory for displaying graphical information of a GUI on an external input/output device (such as a display device coupled to an interface). There may be one or more memories, which may be divided into a program memory 1021, a data memory 1022, and a system memory 1023 according to the type of data stored in the memory. The program memory 1021 is configured to store program instructions required during the operation of the processor, the data memory 1022 is configured to store data required during the operation of the processor, and the system memory 1023 can store an operating system. The memory 102 may include a high-speed random-access memory, and may also include a non-transitory memory, such as at least one magnetic disk storage device, flash memory device, or other non-transitory solid-state storage device.

For an embedded electronic device, the processor 101 and the memory 102 in FIG. 1 may be integrated into a chip. The power consumption of a chip has a great impact on standby time and battery life of a product. Referring to FIG. 1, the memory 102 has a large volume and occupies more than half the area of the chip. Therefore, the power consumption of the memory 102 affects the average power consumption and peak power consumption of the entire chip.

In the prior art, in order to reduce the power consumption of the memory, the memory 102 is divided into multiple slices according to address ranges. For example, in FIG. 1, the program memory 1021 is divided into two slices, the data memory 1022 is divided into two slices, and the system memory 1023 is divided into four slices. It should be understood that the division manner of the slices is not limited in the embodiment, the division may be performed according to an actual situation of the electronic device, and FIG. 1 is only an example. Each slice has its own dedicated clock circuit and power circuit. The clock circuit is used to input a clock control signal to the slice, and the power circuit is used to supply power to the slice. In this way, the processor can flexibly control the turning on and off of each slice. Exemplarily, when the processor is in a working state, the clock circuits and power circuits of all slices are turned on, and when the processor is in a sleep state, the clock circuits or power circuits of some slices are turned off. In this way, under the control of the processor, the power consumption control to the memory can be achieved through a rule program preset in the processor. In this control method, since each slice of the memory is controlled by a control strategy preset in the processor, this control method is referred to as static power consumption control in the present application.

However, the above-mentioned static control method can only control the working mode of the slices of the memory with a coarse granularity. In some working scenarios, there are still some unused working slices in the memory, and these unused working slices will still generate additional power consumption.

In order to solve the above problem, an embodiment of the present application provides a dynamic control method of power consumption, which can dynamically turn on or turn off some slices, according to an actual situation of memory accesses by the processor, so that there is no unused working slice, thereby reducing the power consumption of the memory to the maximum extent.

Figure 2:
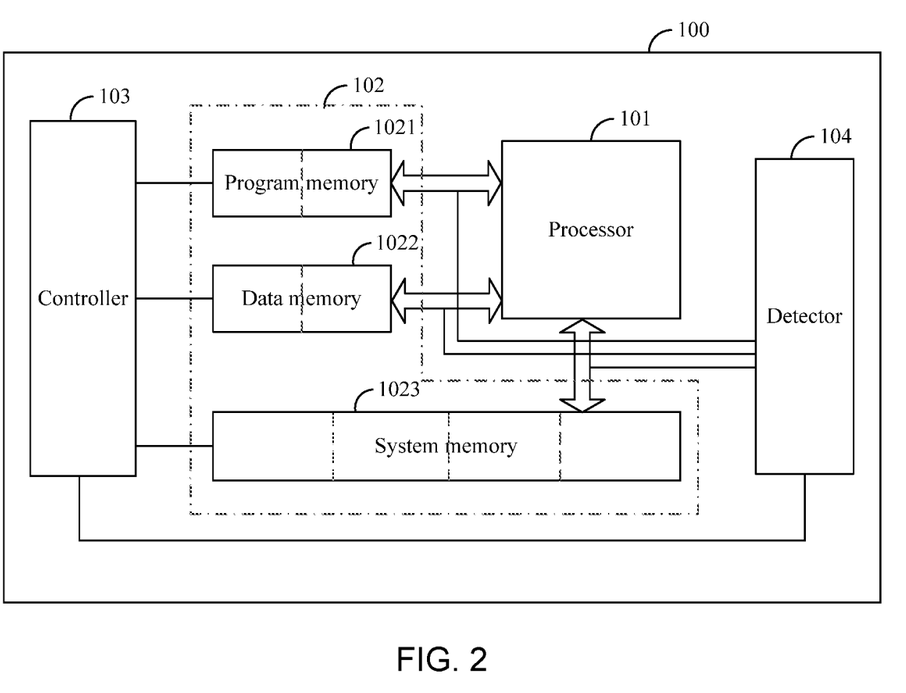
FIG. 2 is a schematic structural diagram of an electronic device according to an embodiment of the present application.

FIG. 2 is a schematic structural diagram of an electronic device according to an embodiment of the present application. As shown in FIG. 2, on the basis of the electronic device shown in FIG. 1, the electronic device 100 provided in the present application may further include a controller 103. The controller 103 may be in the form of software and/or hardware. The controller 103 is connected to the program memory 1021, the data memory 1022, and the system memory 1023, respectively. The controller 103 is used to perform a memory control method in the embodiment, and the controller 103 and the processor 101 operate independently.

In some embodiments, the electronic device 100 of the present application may further include a detector 104. The detector 104 is respectively connected to the program memory 1021, the data memory 1022, and the system memory 1023 through a bus, and is configured to collect address information of accesses to the memories. The detector 104 may be in the form of software and/or hardware. The detector 104 may be connected to the controller 103.

The memory 102 in the embodiment may be an embedded memory, for example, a Static Random-Access Memory (SRAM). The memory 102 can be divided into multiple slices according to the address ranges, and each slice corresponds to its own dedicated clock circuit and power circuit.

In the embodiment, the electronic device shown in FIG. 2 may be an electronic device of an embedded system, for example, a smart speaker, a smart TV, a smart phone, or the like. Specifically, the electronic device includes an embedded chip, and the processor 101, the memory 102, the controller 103, and the detector 104 are integrated into the embedded chip. The embedded chip may be, for example, an AI reasoning chip, an image processing chip, a neural network processing chip, etc. These processing chips may have burst memory access during signal processing. The memory control method provided in the embodiment can dynamically turn on or turn off the memory slices according to the working mode of burst memory access of these processing chips, so as to reduce of the power consumption of the memory to the maximum extent under the premise that the processing chip operates normally.

The memory control method in FIG. 2 is described in detail below with reference to several specific embodiments. The following embodiments can be combined with each other, and the same concept or implementation may not be repeated in some embodiments.

Figure 3:
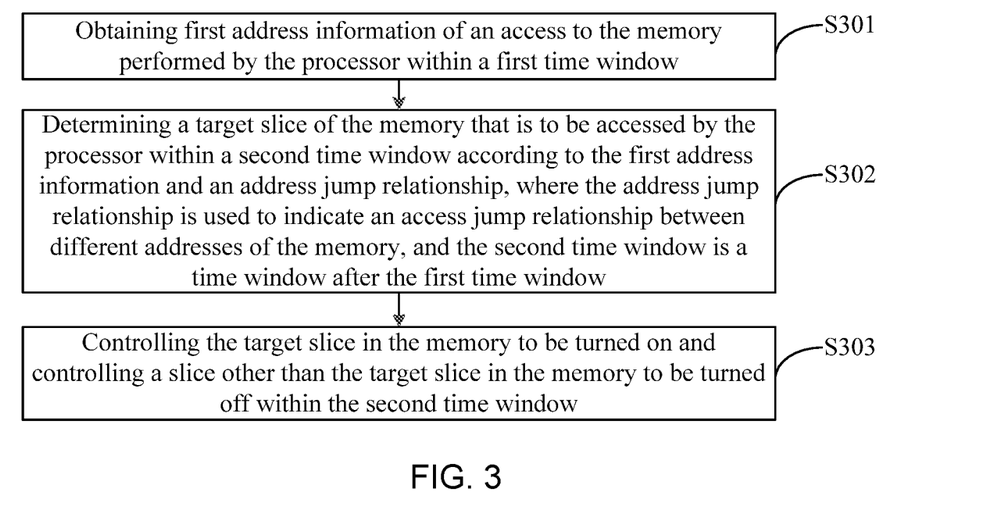
FIG. 3 is a schematic flowchart of a memory control method according to an embodiment of the present application.

FIG. 3 is a schematic flowchart of a memory control method according to an embodiment of the present application. The method in the embodiment can be applied to the electronic device shown in FIG. 2, and the method in the embodiment can be performed by the controller 103. During the operation of the processor, the controller performs S301 to S303 in the embodiment cyclically.

As shown in FIG. 3, the method of the embodiment includes:

S301, obtaining first address information of an access to the memory by the processor within a first time window.

S302, determining a target slice of the memory, which is to be accessed by the processor within a second time window, according to the first address information and an address jump relationship, where the address jump relationship is used to indicate an access jump relationship between different addresses of the memory, and the second time window is a time window after the first time window.

The processor needs to interact with the memory during the operation of the processor. Exemplarily, the processor obtains instructions from the program memory through the bus, obtains data from the data memory, and obtains system data from the system memory. Taking the obtaining of the instructions as an example, when obtaining an instruction from the program memory, the processor first determines an address at which the instruction is stored in the program memory, then accesses the address in the program memory, and reads the corresponding instruction from the address. Therefore, the processor needs to continuously access the memory during operation.

Figure 4:
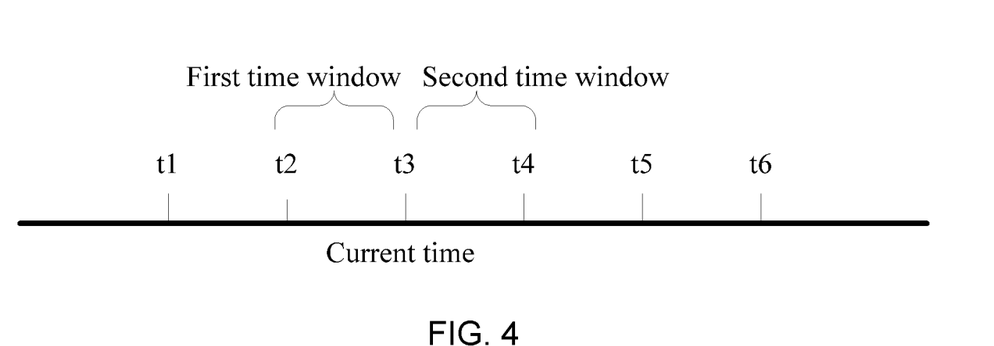
FIG. 4 is a schematic diagram of a time window according to an embodiment of the present application.

The first time window refers to a preset time period before the current time. The second time window refers to a time window after the first time window. The second time window may be the next time window of the first time window, and the second time window may also be spaced from the first time window by one or more time windows. In the embodiment, the length of the time window is not limited. For example, the length of a time window may be one second, or one millisecond. FIG. 4 is a schematic diagram of a time window according to an embodiment of the present application. As shown in FIG. 4, assuming that t3 is the current time, then the first time window may be a time window from t2 to t3, and the second time window may be a time window from t3 to t4. Of course, in some embodiments, the second time window may also be a time window from t4 to t5.

In S301, the controller obtains the first address information of the access to the memory by the processor within the first time window. The first address information is used to indicate an address sequence of the memory accessed by the processor within the first time window. In other words, the first address information indicates the address(es) of the memory accessed by the processor within the first time window.

Optionally, the first address information includes: an access timestamp, an access base address, and an access byte number corresponding to each access to the memory. For example, four bytes which begin from base address 1 were accessed at a first timestamp, one byte which begins from base address 4 was accessed at a second timestamp, and so on.

In a possible implementation, the controller may include an access monitoring module, and the access monitoring module may implement an access monitoring function on the memory. When a certain address of the memory is accessed by the processor, the access monitoring module can record the accessed address to obtain the first address information. In another possible implementation, the access monitoring function can be implemented by the detector. When a certain address of the memory is accessed by the processor, the detector records the accessed address to obtain the first address information, and sends the first address information to the controller.

In S302, the controller predicts the target slice of the memory, which is to be access by the processor within the second time window, according to the first address information and the address jump relationship. The address jump relationship is used to indicate the access jump relationship between different addresses of the memory. It can be understood that the address jump relationship is related to the program running on the processor. When the program running on the processor is fixed, the address jump relationship is also fixed. Therefore, the controller can predict which address of the memory will be accessed within the second time window according to the address jump relationship and the access address sequence indicated by the first address information. Furthermore, the controller determines the slice corresponds to the address to be accessed within the second time window according to the address range corresponding to each slice. In the embodiment, the slice corresponding to the address that is predicted to be accessed within the second time window is referred to as the target slice. It should be understood that the target slice may be one slice or multiple slices.

S303, controlling the target slice in the memory to be turned on and controlling a slice other than the target slice in the memory to be turned off within the second time window.

In the embodiment, after the controller predicts and obtains the target slice corresponding to the address to be accessed in the second time window, the target slice is controlled to be turned on within the second time window so that the target slice is in a working state, with other slice in the memory, except the target slice, being controlled to be turned off within the second time window so as to make the other slice be in an idle state.

Continuing to referring to FIG. 4, if the current time is t4, the second time window in FIG. 4 becomes the first time window. The controller obtains the first address information corresponding to the time window from t3 to t4, determines the target slice corresponding to the time window from t4 to t5 according to the first address information and the address jump relationship, and controls the target slice to be turned on and other slice to be turned off within the time window from t4 to t5.

In the embodiment, each slice is dynamically turned on and off according to the actual situation of memory access. In other words, in each time window, it is only necessary to turn on the target slice that needs to be accessed in the time window, and turn off other slice, so that there is no unused working slice in each time window, thereby reducing the power consumption of the memory to the maximum extent.

In the embodiment, the turning on and off the slice can be implemented by controlling a clock circuit and a power circuit of the slice. Specifically, turning on the slice may mean turning on the clock circuit and the power circuit of the slice so that the slice is in a working state. Turning off the slice may mean turning off the clock circuit of the slice so that the slice is in an idle state. Of course, turning off the slice may also mean turning off the power circuit of the slice so that the slice is in an idle state.

The power consumption management is performed through the clock circuit, that is, the clock signal of the corresponding slice is turned on or off by the clock control logic on the hardware circuit. In this way, when the clock circuit of the slice is turned off, the clock circuit of the slice does not conduct, thereby reducing the power consumption.

The power consumption management is performed through the power circuit, that is, the power consumption of each slice is controlled by turning on or off the power circuit of the slice, or increasing or decreasing the operating voltage of the slice. When the power circuit of the slice is turned off or the operating voltage of the slice is reduced, the power consumption is reduced.

By using the existing hardware foundation (the clock circuit and the power circuit) to control each slice, the implementation cost can be reduced.

It should be understood that turning off the clock circuit and turning off the power circuit can both reduce power consumption, but the effects of reducing the power consumption are different. Turning off the clock circuit will only stop inputting clock control signals to the slice, and power supply will not stop, so the slice may still generate some power consumption. Turning off the power circuit will stop the power supply to the slice, so that the slice does not generate any power consumption. Therefore, the reduction effect of the power consumption of turning off the power circuit is better than that of turning off the clock circuit. In practical applications, selection may be made according to actual conditions, which is not specifically limited in the embodiment.

The memory control method provided in the embodiment includes: obtaining the first address information of an access to the memory by the processer within the first time window; determining, according to the first address information and the address jump relationship, the target slice of the memory which is to be accessed by the processor within the second time window, where the address jump relationship is used to indicate the access jump relationship between different addresses of the memory, and the second time window is a time window after the first time window; and controlling the target slice in the memory to be turned on and controlling the slice other than the target slice in the memory to be turned off within the second time window. Through the above-mentioned process, each slice is dynamically turned on and off according to the actual situation of memory access. In each time window, only the target slice that needs to be accessed in the time window is required to be turned on, and other slice is turned off, so that there is no unused working slice in each time window, thereby reducing the power consumption of the memory to the maximum extent.

Figure 5:
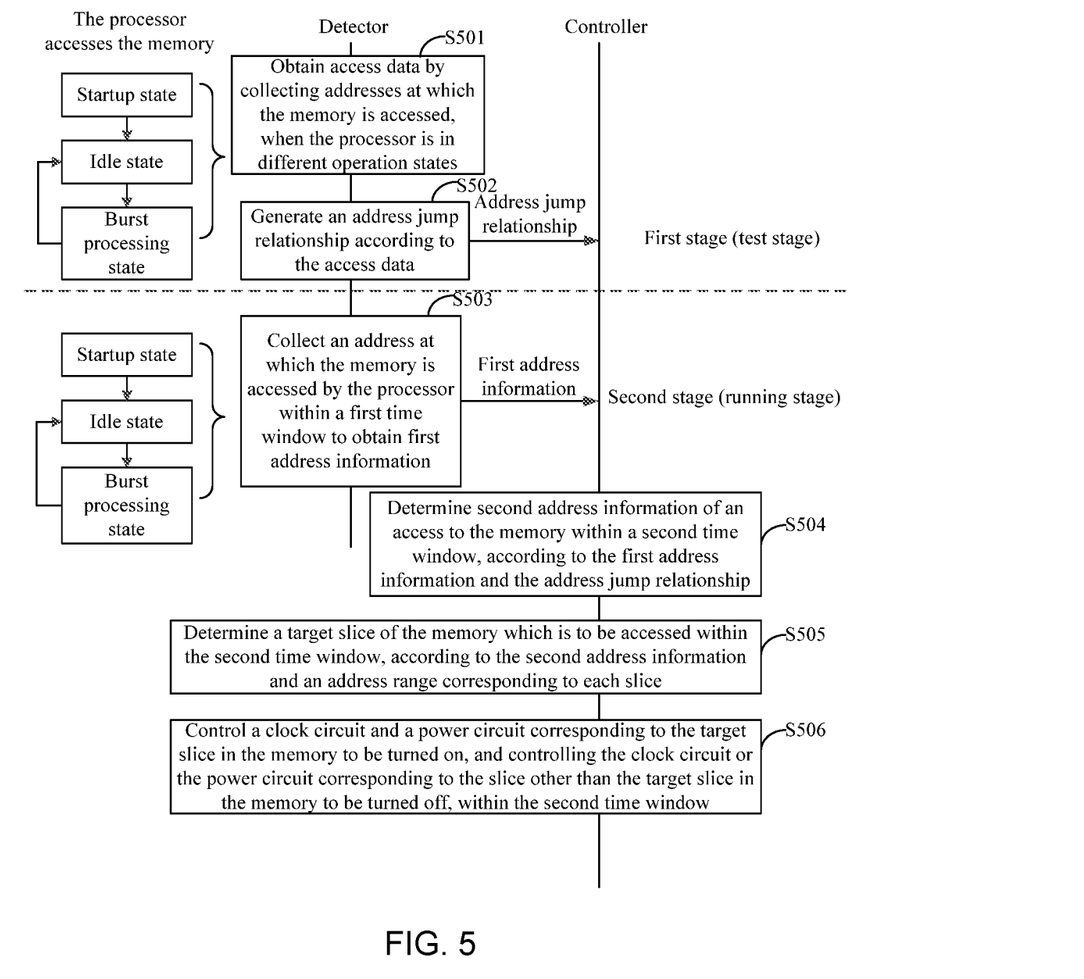
FIG. 5 is a schematic flowchart of a memory control method according to an embodiment of the present application.

FIG. 5 is a schematic flowchart of a memory control method according to an embodiment of the present application. The embodiment implements the control process on the memory using the detector and the controller in FIG. 2. As shown in FIG. 5, the method in the embodiment includes:

S501, the detector obtains, when the processor is in different operation states, access data by collecting addresses at which the memory is accessed, where the access data is used to indicate access addresses corresponding to different times.

S502, the detector generates the address jump relationship according to the access data and sends the address jump relationship to the controller.

As shown in FIG. 5, S501 to S506 in the embodiment are performed in two stages. The first stage is a test stage, in which the detector performs S501 to S502 to generate the address jump relationship. The second stage is a running stage, in which the detector performs S503 to collect and obtain the first address information, and the controller performs S504 to S506 to determine the target slice according to the first address information and the address jump relationship and controls the on/off of each slice according to the determined target slice. The two stages are described in detail below.

In the first stage, the detector works in parallel with the processor and the memory, and the controller does not need to work. When the processor is in different operation states, the detector obtains the access data by collecting the addresses at which the memory is accessed. The access data is used to indicate the access addresses corresponding to different times. For example, the access data includes an access timestamp, an access base address, and an access byte number corresponding to each access to the memory by the processor.

Further, the detector generates the address jump relationship according to the collected access data. The address jump relationship indicates the jump rule between addresses of the memory that need to be accessed during the operation of the processor. For example, after the processor accesses the memory at address 1, it will then access address 5 and then address 10. In this way, in the subsequent running stage, when the detector detects that the processor is currently accessing address 1, it can predict that the processor will access address 5 next according to the address jump relationship. Therefore, the address jump relationship can be used to predict and obtain the address at which the memory is to be accessed within the second time window according to the address at which the memory is accessed within the first time window.

The address jump relationship in the embodiment may be in multiple forms, for example, it may be in the form of a data table, in the form of a function, or in the form of microcode.

In some implementations, the step of generating the address jump relationship may be performed online by the detector. Exemplarily, the detector performs online collection of the addresses at which the memory is accessed, and performs real-time analysis on the collected access data to generate the address jump relationship. In some implementations, the step of generating the address jump relationship may also be performed offline. Exemplarily, the detector is connected to a data analysis tool. The detector performs online collecting and recording of the addresses at which the memory is accessed, to obtain the access data. The access data can be exported to the data analysis tool offline, and the data analysis tool analyzes and processes the access data to generate the address jump relationship, and returns the address jump relationship to the detector.

In practical applications, the first stage usually only needs to be performed once. It can be understood that after the design of the chip system is completed, that is, after the program instructions to be executed by the processor are determined, the detector performs S501 and S502 in the embodiment to generate the address jump relationship during the operation of the processor in the test stage, and sends the address jump relationship to the controller.

It can be understood that when performing S501 and S502 in the test stage, it is necessary to traverse various operation states of the processor. In other words, it is necessary to ensure that the access data of the memory is collected under different operation states of the processor, to ensure the completeness of the generated address jump relationship. The operation states of the processor include, but are not limited to, a startup state, an idle state, a burst processing state or the like.

In some application scenarios, after the address jump relationship is generated by the detector in the test stage, the address jump relationship can further be output to an output device of the electronic device, for example, displayed on the display screen of the electronic device. In this way, a software designer can visually see the address jump relationship, and then analyze and obtain the access situation of each slice according to the address jump relationship. Furthermore, the embedded code in the chip can be optimized according to the access situation of each slice, and the memory slices that are not fully used can be used in combination, to reduce the number of memory slices used, thereby reducing the power consumption of the memory from the source, that is, from the code.

S503, the detector collects an address at which the memory is accessed by the processor within the first time window to obtain the first address information, and sends the first address information to the controller.

S504, the controller determines, according to the first address information and the address jump relationship, second address information of an access to the memory performed by the processor within the second time window.

S505, the controller determines, according to the second address information and the address range corresponding to each slice, a target slice of the memory which is to be accessed by the processor within the second time window.

S506, within the second time window, the controller controls a clock circuit and a power circuit corresponding to the target slice in the memory to be turned on, and controls the clock circuit or the power circuit corresponding to the slice other than the target slice in the memory to be turned off.

In the second stage, the detector and the controller work in parallel with the processor and the memory. During the normal operation of the processor, the detector collects the first address information of the access to the memory performed by the processor within the first time window, and sends the first address information to the controller. Thereby, the controller determines the target slice of the memory which is to be accessed within the second time window, according to the first address information and the address jump relationship. The processing process of S504 to S506 of the controller in the embodiment is similar to the embodiment shown in FIG. 3, and details are not described herein again.

In the embodiment, each slice is dynamically turned on and off according to the actual situation of memory access. In each time window, only the target slice that needs to be accessed in the time window is required to be turned on, and other slice is turned off, so that there is no unused working slice in each time window, thereby reducing the power consumption of the memory to the maximum extent.

Figure 6:
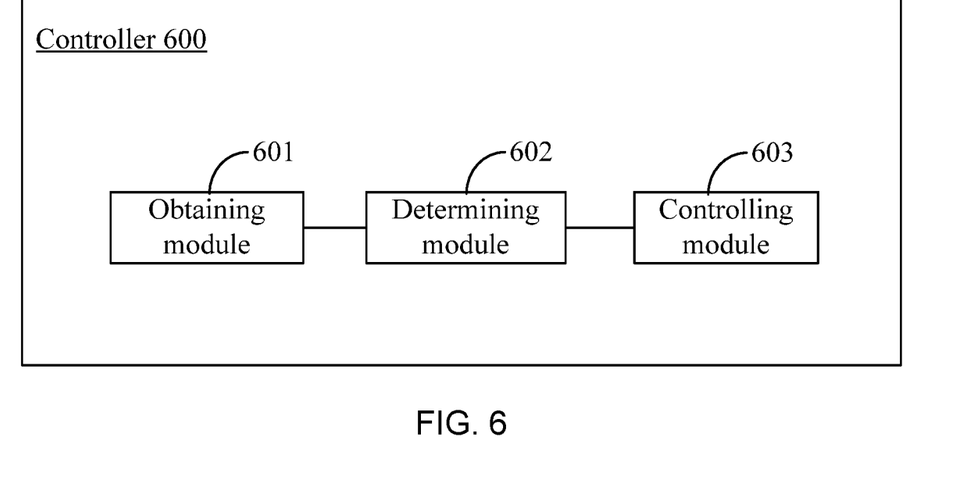
FIG. 6 is a schematic structural diagram of a controller according to an embodiment of the present application.

FIG. 6 is a schematic structural diagram of a controller according to an embodiment of the present application. The controller of the embodiment can be applied to the electronic device as shown in FIG. 2. As shown in FIG. 6, the controller 600 in the embodiment includes:

an obtaining module 601, configured to obtain first address information of an access to the memory performed by the processor within a first time window;

a determining module 602, configured to determine a target slice of the memory, which is to be accessed by the processor within a second time window, according to the first address information and an address jump relationship, where the address jump relationship is used to indicate an access jump relationship between different addresses of the memory, and the second time window is a time window after the first time window; and a controlling module 603, configured to control the target slice in the memory to be turned on and control a slice other than the target slice in the memory to be turned off within the second time window.

In a possible implementation, the determining module 602 is specifically configured to:

determine, according to the first address information and the address jump relationship, second address information of an access to the memory performed by the processor within the second time window; and determine, according to the second address information and an address range corresponding to each slice, the target slice of the memory which is to be accessed by the processor within the second time window.

In a possible implementation, the controlling module 603 is specifically configured to:

control a clock circuit and a power circuit corresponding to the target slice in the memory to be turned on, and control a clock circuit or a power circuit corresponding to the slice other than the target slice in the memory to be turned off.

In a possible implementation, the electronic device further includes a detector, and the obtaining module 601 is specifically configured to:

receive, from the detector, the first address information of the access to the memory performed by the processor within the first time window, where the first address information is obtained by the detector through collecting an address at which the memory is accessed.

In a possible implementation, the obtaining module 601 is further configured to:

receive the address jump relationship from the detector, where the address jump relationship is generated by the detector according to access data, and the access data is used to indicate access addresses corresponding to different times;

where the access data is obtained by the detector through collecting addresses at which the memory is accessed when the processor is in different operation states.

In a possible implementation, the first address information includes: an access timestamp, an access base address, and an access byte number corresponding to each access to the memory.

In a possible implementation, the memory is a static random-access memory SRAM.

The controller of the embodiment can be used to implement the technical solution performed by the controller in any of the above method embodiments. The implementation principles and technical effects are similar, and are not repeated here.

Figure 7:
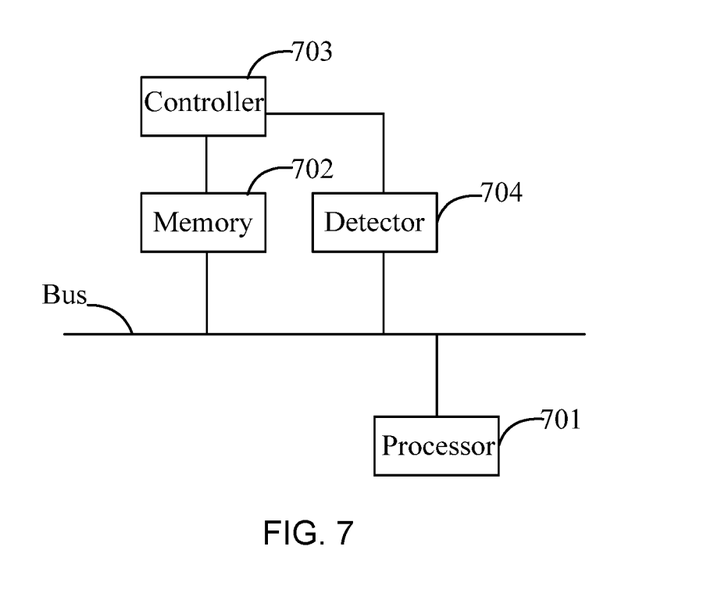
FIG. 7 is a schematic structural diagram of a chip according to an embodiment of the present application.

FIG. 7 is a schematic structural diagram of a chip according to an embodiment of the present application. As shown in FIG. 7, the chip includes: a processor 701, a memory 702, a detector 704, and a controller 703. The detector 704 is connected to the memory 702 through a bus, and the detector 704 is used to generate an address jump relationship according to addresses at which the memory 702 is accessed by the processor 701; the detector 704 is further used to collect first address information of an access to the memory 702 performed by the processor 701 within a first time window; the controller 703 is used to perform the method performed on the controller side in any one of the foregoing method embodiments. The implementation principles and technical effects are similar, and are not repeated here.

An electronic device according to an embodiment of the present application includes the chip as shown in FIG. 7.

The electronic device according to an embodiment of the present application may adopt the structure as shown in FIG. 2

The electronic device in the present application is intended to represent various forms of digital computers, such as a laptop computer, a desktop computer, a workbench, a personal digital assistant, a server, a blade server, a mainframe computer, and other suitable computer. The electronic device may represent various forms of mobile devices, such as a personal digital assistant, a cellular phone, a smart phone, a wearable device, and other similar computing device. The components shown here, their connections and relationships, and their functions are merely examples, and are not intended to limit the implementation of the application described and/or required herein.

The electronic device provided in the present application may further include: an input device and an output device. The processor, the memory, the input device, and the output device may be connected through a bus or in other manners.

The input device can receive inputted numeric or character information and generate key signal inputs related to user settings and function control of the electronic device, the input device may be, for example, a touch screen, a keypad, a mouse, a trackpad, a touchpad, a pointing stick, one or more mouse buttons, a trackball, a joystick, or the like. The output device may include a display device, an auxiliary lighting device (for example, an LED), a haptic feedback device (for example, a vibration motor), and the like. The display device may include, but is not limited to, a liquid crystal display (LCD), a light emitting diode (LED) display, and a plasma display. In some implementations, the display device may be a touch screen.

Various implementations of the systems and technologies described herein may be implemented in a digital electronic circuit system, an integrated circuit system, a specific ASIC (application specific integrated circuit), computer hardware, firmware, software, and/or combinations thereof. These various implementations may include implementation in one or more computer programs, where the one or more computer programs can be executed and/or interpreted on a programmable system including at least one programmable processor. The programmable processor may be a dedicated or general-purpose programmable processor, which can receive data and instructions from a storage system, at least one input device, and at least one output device, and transmit the data and instructions to the storage system, the at least one input device and the at least one output device.

These computing programs (also known as programs, software, software applications, or codes) include machine instructions of the programmable processor and can be implemented utilizing high-level procedures and/or object-oriented programming language, and/or assembly/machine language. As used herein, the terms "machine-readable medium" and "computer-readable medium" refer to any computer program product, device, and/or device used to provide machine instructions and/or data to the programmable processor (for example, a magnetic disk, an optical disk, a memory, a programmable logic device (PLD)), including a machine-readable medium that receives machine instructions as machine-readable signals. The term "machine-readable signal" refers to any signal used to provide machine instructions and/or data to the programmable processor.

In order to provide interaction with the user, the systems and technologies described herein may be implemented on a computer, where the computer includes: a display device (for example, a CRT (Cathode Ray Tube) or an LCD (Liquid Crystal Display) monitor) for displaying information to the user; and a keyboard and a pointing device (such as a mouse or trackball) through which the user can provide input to the computer. Other kinds of devices may also be used to provide interaction with the user. For example, the feedback provided to the user may be any form of sensory feedback (e.g., visual feedback, auditory feedback, or haptic feedback); and the input from the user may be received in any form (including acoustic input, voice input, or tactile input).

The systems and technologies described herein can be implemented in a computing system that includes back-end components (for example, a data server), or a computing system that includes middleware components (for example, an application server), or a computing system that includes front-end components (for example, a user computer with a graphical user interface or a web browser, through which the user can interact with the user computer described herein), or a computing system that includes any combination of such back-end components, middleware components, and front-end components. The components of the system may be interconnected by any form or medium of digital data communication (e.g., a communication network). Examples of a communication network include: local area network (LAN), wide area network (WAN), and the Internet.

A computer system may include a client and a server. The client and the server are generally remote from each other and typically interact through a communication network. A relationship of the client and the server is generated by running computer programs that have a client-server relationship with each other on the respective computers.

It should be understood that the various forms of processes shown above can be used to reorder, add, or delete steps. For example, the steps described in the present application can be performed in parallel, sequentially, or in a different order. As long as the desired results of the technical solutions disclosed in the present application can be achieved, there is no limitation herein.

The foregoing specific implementations do not constitute a limitation to the protection scope of the present application. It should be understood by those skilled in the art that various modifications, combinations, sub-combinations, and substitutions may be made according to design requirements and other factors. Any modification, equivalent substitution and improvement made within the spirit and principle of the present application shall be included in the protection scope of the present application.

What is claimed is:

1. A memory control method, wherein the method is applied to an electronic device, the electronic device comprises a memory, a processor and a controller, the memory comprises a plurality of slices, and the method is performed by the controller and comprises:
   obtaining first address information of an access to the memory performed by the processor within a first time window;
   determining, according to the first address information and an address jump relationship, a target slice of the memory that is to be accessed by the processor within a second time window, wherein the address jump relationship is used to indicate an access jump relationship between different addresses of the memory, and the second time window is after the first time window; and
   controlling the target slice in the memory to be turned on and controlling a slice other than the target slice in the memory to be turned off within the second time window;
   wherein the first address information comprises: an access timestamp, an access base address, and an access byte number corresponding to each access to the memory.

2. The method according to claim 1, wherein the determining, according to the first address information and an address jump relationship, a target slice of the memory which is to be accessed by the processor within a second time window comprises:
  determining, according to the first address information and the address jump relationship, second address information of an access to the memory performed by the processor within the second time window; and
  determining, according to the second address information and an address range corresponding to each of the slices, the target slice of the memory that is to be accessed by the processor within the second time window.

3. The method according to claim 1, wherein the controlling the target slice in the memory to be turned on and controlling a slice other than the target slice in the memory to be turned off comprises:
  controlling a clock circuit and a power circuit corresponding to the target slice in the memory to be turned on, and controlling a clock circuit or a power circuit corresponding to the slice other than the target slice in the memory to be turned off.

4. The method according to claim 1, wherein the electronic device further comprises a detector; and the obtaining first address information of an access to the memory performed by the processor within a first time window comprises:
  receiving, from the detector, the first address information of the access to the memory performed by the processor within the first time window, wherein the first address information is obtained by the detector through collecting an address at which the memory is accessed.

5. The method according to claim 4, wherein before the determining, according to the first address information and an address jump relationship, a target slice of the memory that is to be accessed by the processor within a second time window, the method further comprises:
  receiving the address jump relationship from the detector, wherein the address jump relationship is generated by the detector according to access data, and the access data is used to indicate access addresses corresponding to different times;
  wherein the access data is obtained by the detector through collecting addresses at which the memory is accessed when the processor is in different operation states.

6. The method according to claim 1, wherein the memory is a static random-access memory (SRAM).

7. A controller, wherein the controller is applied to an electronic device, the electronic device comprises a memory, a processor and the controller, the memory comprises a plurality of slices and stores instructions, and the controller is connected to the memory and configured to execute the instructions in the memory to:
  obtain first address information of an access to the memory performed by the processor within a first time window;
  determine, according to the first address information and an address jump relationship, a target slice of the memory that is to be accessed by the processor within a second time window, wherein the address jump relationship is used to indicate an access jump relationship between different addresses of the memory, and the second time window is after the first time window; and
  control the target slice in the memory to be turned on and control a slice other than the target slice in the memory to be turned off within the second time window;
  wherein the first address information comprises: an access timestamp, an access base address, and an access byte number corresponding to each access to the memory.

8. The controller according to claim 7, wherein the controller is configured to execute the instructions in the memory to:
  determine, according to the first address information and the address jump relationship, second address information of an access to the memory performed by the processor within the second time window; and
  determine, according to the second address information and an address range corresponding to each of the slices, the target slice of the memory that is to be accessed by the processor within the second time window.

9. The controller according to claim 7, wherein the controller is configured to execute the instructions in the memory to:
  control a clock circuit and a power circuit corresponding to the target slice in the memory to be turned on, and control a clock circuit or a power circuit corresponding to the slice other than the target slice in the memory to be turned off.

10. The controller according to claim 7, wherein the electronic device further comprises a detector which is connected to the controller; and the controller is configured to execute the instructions in the memory to:
  receive, from the detector, the first address information of the access to the memory performed by the processor within the first time window, wherein the first address information is obtained by the detector through collecting an address at which the memory is accessed.

11. The controller according to claim 10, wherein the controller is further configured to execute the instructions in the memory to:
  receive the address jump relationship from the detector, wherein the address jump relationship is generated by the detector according to access data, and the access data is used to indicate access addresses corresponding to different times;
  wherein the access data is obtained by the detector through collecting addresses at which the memory is accessed when the processor is in different operation states.

12. The controller according to claim 7, wherein the memory is a static random-access memory (SRAM).

13. A chip, comprising: a processor, a memory, a detector and a controller, wherein the detector is connected to the memory, and the detector is configured to generate an address jump relationship according to addresses at which the memory is accessed by the processor; wherein the detector is further configured to collect first address information of an access to the memory performed by the processor within a first time window; and
  the controller is configured to perform the method according to claim 1.

14. An electronic device, comprising: the chip according to claim 13.

* * * * *